United States Patent [19]

Okuhara et al.

[11] Patent Number: 5,102,775
[45] Date of Patent: Apr. 7, 1992

[54] VISIBLE LIGHT SENSITIVE ELECTRODEPOSITION COATING COMPOSITION AND IMAGE-FORMING METHOD USING THE SAME

[75] Inventors: Motoko Okuhara, Yokohama; Ichiro Yoshihara, Fujisawa; Yasuo Doi, Ebina; Takao Yamamoto, Yokosuka; Kenji Seko, Yokosuka; Yutaka Yoshikawa; Naozumi Iwasawa, both of Hiratsuka, all of Japan

[73] Assignee: Kansai Paint Co., Ltd., Kanagawa, Japan

[21] Appl. No.: 413,677

[22] Filed: Sep. 28, 1989

[30] Foreign Application Priority Data

Sep. 30, 1988 [JP] Japan .................................. 63-246394
Jul. 12, 1989 [JP] Japan .................................. 1-178041

[51] Int. Cl.⁵ .................................................. G03F 7/038
[52] U.S. Cl. ..................................... 430/287; 430/945;
430/286; 430/285; 430/926; 430/922; 430/920;
430/919; 430/935; 204/180.6; 204/181.4;
204/181.6; 204/181.7; 522/15; 522/24; 522/25;
522/26; 522/29
[58] Field of Search ............... 430/945, 287, 286, 285,
430/926, 922, 920, 919, 935; 204/180.6, 181.4,
181.6, 181.7; 522/15, 24, 25, 26, 29

[56] References Cited

U.S. PATENT DOCUMENTS

| | | | |
|---|---|---|---|
| 3,497,356 | 2/1970 | Martinson | 430/287 X |
| 3,544,440 | 12/1970 | Weigel | 204/181.4 X |
| 3,954,587 | 5/1976 | Kokawa | 204/181.6 X |
| 3,971,709 | 7/1976 | Ohsawa et al. | 204/180.6 |
| 4,029,561 | 6/1977 | McGinniss | 204/180.6 |
| 4,419,468 | 12/1983 | Lucas | 204/181.7 X |
| 4,474,868 | 10/1984 | Yamaoka et al. | 522/24 X |
| 4,548,891 | 10/1985 | Riediker et al. | 430/287 X |
| 4,592,816 | 6/1986 | Emmons et al. | 204/180.6 |
| 4,707,432 | 11/1987 | Gatechair et al. | 522/25 X |
| 4,766,055 | 8/1988 | Kawabata et al. | 430/926 X |
| 4,845,012 | 7/1989 | Seko et al. | 204/181.6 X |

FOREIGN PATENT DOCUMENTS

1489425 10/1977 United Kingdom ................ 430/935

OTHER PUBLICATIONS

Douglas A. Olsen, "Physical Chemistry Concepts in the Electrodeposition of Organic Coatings", *Journal of Paint Technology*, Aug. 1966, vol. 38, No. 499, pp. 429-435.

*Primary Examiner*—Cynthia Hamilton
*Attorney, Agent, or Firm*—Wenderoth, Lind & Ponack

[57] ABSTRACT

A composition for visible light sensitive electrodeposition coating which comprises (A) a photocurable resin having light sensitive groups capable of being crosslinked or polymerized by light irradiation and ionic groups, (B) a sensitizer which is excited by absorption of visible light and has a property to interact with the resin (A), (C) a water-insoluble polymerization initiator, and optionally, (D) at least one specific nitrogen-containing compound; and an image-forming method which comprises (i) coating the surface of a conductor by electrodeposition with the aforesaid composition, (ii) exposing the resulting film by electrodeposition by partially irradiating the film with visible light, and then (iii) contacting the resulting film with a developing solution to remove the unexposed areas.

18 Claims, No Drawings

VISIBLE LIGHT SENSITIVE ELECTRODEPOSITION COATING COMPOSITION AND IMAGE-FORMING METHOD USING THE SAME

This invention relates to a composition for visible light sensitive electrodeposition coating and an image-forming method using the composition for electrodeposition coating.

BACKGROUND OF THE INVENTION

Light sensitive compositions are widely used for various uses, for example for photoresist, plate materials for lithography or letterpress, presensitized plates (PS plate) for offset printing, information recording materials, materials for making a relief image, and the like.

There are problems that although many of these light sensitive compositions are light sensitive to ultraviolet rays, the photographic sensitivity thereof is generally several ten to several hundred $mJ/cm^2$ and thus light sources of high output are required and moreover the efficiency of energy conversion to the recording is poor. On the other hand, there is an image-forming method wherein an image is directly formed using a light of high energy density such as laser. This method has not only an advantage that energy conversion efficiency becomes better but an advantage that image-forming steps may greatly be simplified. As for light sources for scanning exposure in direct image formation, it is advantageous to use visible light laser, which gives emission of radiation stable in lifetime and intensity, rather than ultraviolet laser. Thus, there has been desired the emergence of visible light sensitive composition having a sensitivity such that scanning exposure by visible light laser is possible, and many visible light sensitive compositons having a high sensitivity to $Ar^+$ laser, which has a stable emission of radiation in a visible region of wavelength 488 nm, have been proposed (please refer, for example, to Japanese Laid-Open Patent Publications Nos. 31848/1987, 233736/1986 and 221403/1985, European Patent 55486, Printed Circuit World Convention IV, technical paper 22 -2 in page 91 of Gists of the 1st Academic Lecture Mass Meeting of the Printed Circuit Society, etc.).

The form of these visible light sensitive compositions is liquid or film-like, but these compositions have the following drawbacks:

Liquid visible light sensitive compositions have many problems on workability, for example, that it is difficult to form a uniform and smooth film, it is difficult to apply them so as to make a desired film thickness, they cannot be applied uniformly onto a complicatedly-shaped article. Further, liquid visible light sensitive compositions also have the problem on safety and hygiene that they are harmful for human bodies because of high content of organic solvents therein.

On the other hand, visible light sensitive coats molded into a film-shape have the problems, for example, that an image formed by light application is not distinct because of thick film thickness of several ten micrometers, it is difficult to uniformly closely contact the film with the surface of a conductor, and products become expensive because the film cannot effectively be utilized due to unavoidable loss of the film.

Therefore, there has strongly been desired the appearance of visible light sensitive compositions to solve the above problems.

BRIEF SUMMARY OF THE INVENTION

The present inventors have vigorously studied for solving the above problems, have found that a composition for electrodeposition coating comprising a photocurable resin, a particular sensitizer and a water-insoluble polymerization initiator solves the above problems, and that the composition for electrodeposition coating to which a particular nitrogen-containing compound was further compounded exhibits a higher sensitivity and is capable of formation of an image of high resolving power, and have completed this invention.

Thus, according to this invention, there is provided a composition for visible light sensitive electrodeposition coating which comprises (A) a photocurable resin having light sensitive groups capable of being crosslinked or polymerized by light irradiation and ionic groups (hereinafter sometimes referred to as "photocurable resin"), (B) a sensitizer which is excited by absorption of visible light and has a property to interact with the resin (A), (C) a water-insoluble polymerization initiator, and, if necessary, further (D) at least one of the nitrogen-containing compounds represented by the following general formulae (1) to (6):

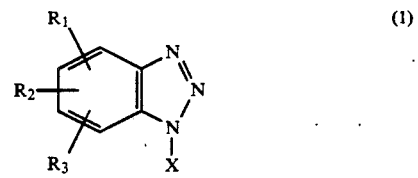

wherein X represents a hydrogen atom or hydroxyl group, $R_1$, $R_2$ and $R_3$ independently represent a hydrogen atom, chlorine atom or alkyl group having 1 to 6 carbon atoms;

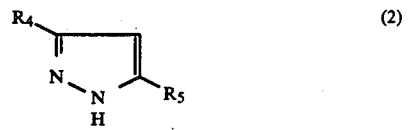

wherein $R_4$ and $R_5$ independently represent a hydrogen atom, or alkyl group having 1 to 6 carbon atoms;

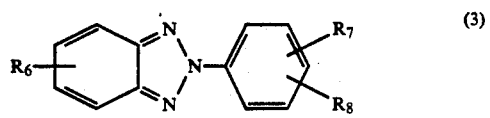

wherein $R_6$, $R_7$ and $R_8$ independently represent a hydrogen atom, hydroxyl group or alkyl group having 1 to 12 carbon atoms;

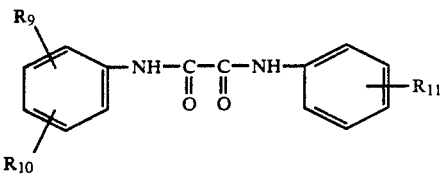

(4)

wherein $R_9$, $R_{10}$ and $R_{11}$ independently represent a hydrogen atom, hydroxyl group, alkyl group having 1 to 12 carbon atoms or alkoxy group having 1 to 12 carbon atoms;

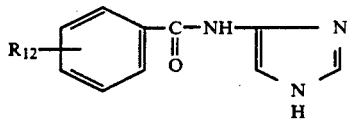

(5)

wherein $R_{12}$ represents a hydrogen atom, hydroxyl group, alkyl having having 1 to 12 carbon atoms or alkoxy group having 1 to 12 carbon aoms;

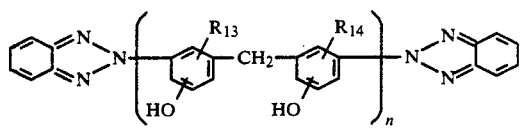

(6)

wherein $R_{13}$ and $R_{14}$ independently represent a hydrogen atom or alkyl group having 1 to 12 carbon atoms and n is an integer of 1 to 3. According to this invention there is further provided an image-forming method which comprises (i) coating the surface of a conductor by electrodeposition with the above composition for electrodeposition coating,
(ii) exposing the resulting electrodeposited film by partially irradiating the film with visible light, and then
(iii) contacting the resulting film with a developing solution to remove the unexposed areas.

This invention is further detailedly described below.

DETAILED DESCRIPTION OF THE INVENTION

(A) Photocurable resin

The photocurable resin (A) used in this invention includes a photocurable polymer soluble in an aqueous alkali solution or aqueous acid solution which has light sensitive groups capable of being crosslinked or polymerized by light irradiation and ionic groups, namely anionic or cationic groups, the polymer being crosslinked or polymerized by light irradiation to become substantially insoluble or sparingly soluble in the aqueous alkali or acid solution.

The light sensitive groups existing in the photocurable resin (A) are groups capable of being crosslinked or polymerized by light irradiation in the presence of the sensitizer (B) and the water-insoluble polymerizable initiator (C), and specific examples of the light sensitive group having such characteristic include, for example, a (meth)acryloyl group ($CH_2=CR-CO-$ wherein R represents a hydrogen atom or a methyl group), a cinnamoyl group, an allyl group, etc.

The above photocurable resin (A) has the above anionic or cationic groups besides the light sensitive groups. Although the amount of the ionic groups and light sensitive groups may widely be changed depending on kind and molecular weight of the polymer as a base material, and the like, it is generally suitable that the anionic group such as a carboxyl group is contained in an amount such that the acid value of the photocurable resin falls within the range of 20 to 300, preferably 30 to 100 (mg KOH/g resin, as is the same hereinafter); the cationic group such as a tartiary amino group or an onium base is usually contained in an amount ranging 0.2 to 5, preferably 0.3 to 2.0 moles/kg resin; and the light sensitive group is contained in an amount of 0.2 to 5.0, preferably 0.7 to 4.5 moles/kg resin.

Further, the photocurable resin (A) may have a number average molecular weight of generally 300 to 100,000, preferably 1,000 to 50,000, more preferably 3,000 to 30,000. It is preferred that the glass transition temperature (Tg) of the photocurable resin (A) is 0° C. or higher, particularly within the range of 5 to 70° C. If the amount of the ionic groups in the photocurable resin is smaller than the lower limit of the above range, the resin cannot generally be made water soluble or water dispersible, which as a result makes it difficult to form the electrodeposition coating composition. On the other hand, if the amount of the ionic groups is beyond the upper limit, it becomes difficult to apply the electrodeposition coating onto a base plate, which results in a tendency to require a large electric power through increase of the amount to be applied.

Further, if the number average molecular weight of the photocurable resin is less than 300, it tends to become difficult to obtain a uniform film. On the other hand, if the number average molecular weight goes beyond 100,000, a tendency is seen that the smoothness of the electrodeposited film becomes worse to give an uneven film surface and the definition of an image becomes poor.

Further, if the Tg of the photocurable resin is less than 0° C., a tendency is generally seen that the electrodeposited film exhibits stickiness and dust and the like are liable to stick to the film, which makes the handling of the film troublesome.

The anionic photocurable resin (A) to be used in this invention is specifically described below.

(i) photocurable resin having (meth)acryloyl groups as the light sensitive groups The present photocurable resin may, for example, be prepared by linking a glycidyl group-containing unsaturated compound to an acrylic resin having a high acid value. The acrylic resin of a high acid value to be used therein may be obtained, for example, by copolymerizing $\alpha\beta$-ethylenic unsaturated acid such as acrylic acid or methacrylic acid with at least one unsaturated monomer selected from a (meth)acrylic ester such as methyl (meth)acrylate, ethyl (meth)acrylate, propyl (meth)acrylate, butyl (meth)acrylate, 2-ethylhexyl (meth)acrylate or hydroxyethyl (meth)acrylate; styrene; (meth)acrylonitrile; (meth)acrylamide; etc. The $\alpha\beta$-ethylenic unsaturated acid may generally be used in an amount such that the acid value of the acrylic resin falls within the range of 40 to 650, preferably 60 to 500. Further, the number average molecular weight and glass transition temperature (Tg) of the acrylic resin of a high acid value are suitably adjusted so that the photocurable resin obtained by linkage of the glycidyl group-containing unsaturated compound to the acrylic resin may have the above number average molecular weight and Tg.

On the other hand, specific examples of the glycidyl group-containing unsaturated compound to be linked to the above acrylic resin of a high acid value include glycidyl acrylate, glycidyl methacrylate, etc.

The addition reaction between the above acrylic resin of a high acid value and the glycidyl group-containing unsaturated compound may easily be carried out according to a per se known process, for example, by carrying the reaction at 80° to 120° for 1 to 5 hours using a catalyst such as tetraethylammonium bromide.

Further, the present photocurable resin may also be prepared by linking a reaction product of a hydroxyl group-containing polymerizable unsaturated compound with a diisocyanate compound to the acrylic resin of a high acid value having hydroxyl groups described in the later item (ii).

Examples of the hydroxyl group-containing polymerizable unsaturated compound include, for example, 2-hydroxyethyl acrylate, 2-hydroxyethyl methacrylate, 2-hydroxypropyl acrylate, N-methylolacrylamide, etc., and examples of the diisocyanate compound include, for example, tolylene diisocyanate, xylylene diisocyanate, hexamethylene diisocyanate, lysine diisocyanate, etc.

(ii) photocurable resin having cinnamoyl groups as a light sensitive group

The present photocurable resin may, for example, be prepared by reacting an acrylic resin of a high acid value having hydroxyl groups with a substituted or unsubstituted cinnamoyl halide in the presence of a base, for example, in a pyridine solvent. The hydroxyl group-containing acrylic resin of a high acid value to be used may be prepared by copolymerizing the $\alpha\beta$-ethylenic unsaturated acid and hydroxyl group-containing polymerizable unsaturated compound, which are described in the above item (i), as indispensable ingredients, with at least one of other unsaturated monomers described in above (i).

In the preparation of the hydroxyl group-containing acrylic resin of a high acid value, the $\alpha,\beta$-ethylenic unsaturated acid may generally be used in an amount such that the acid value of the photocurable resin to be obtained falls within 20 to 300, preferably 30 to 100, and the hydroxyl group-containing polymerizable unsaturated compound may generally be used in an amount of 5 to 97, preferably 20 to 75 weight parts, per 100 weight parts of the acrylic resin of a high acid value.

Further, the substituted or unsubstituted cinnamoyl halide may generally be used in an amount of 6 to 180, preferably 30 to 140 weight parts, per 100 weight parts of the hydroxyl group-containing acrylic resin of a high acid value.

Examples of the substituted or unsubstituted cinnamoyl halide include cinnamoyl halides optionally having 1 to 3 substituents selected from nitro groups, lower alkyl groups and the like or the benzene ring, more specifically cinnamoyl chloride, p-nitrocinnamoyl chloride, p-methoxycinnamoyl chloride, p-ethoxycinnamoyl chloride, etc.

The reaction of the substituted or unsubstituted cinnamoyl halide with the hydroxyl group-containing acrylic resin may, for example, be carried out by adding 20 to 100 weight parts of pyridine to 100 weight parts of the acrylic resin solution, dropwise adding at 10° C. or less cinnamoyl chloride dissolved in 20 to 100 weight parts of dimethylformamide and then stirring the mixture at 30° to 70° C. for 3 to 8 hours. Purification may be carried out by precipitating the polymer with addition of methanol, reprecipitating the polymer with a mixture of tetrahydrofuran and water and further reprecipitating the polymer with a mixture of tetrahydrofuran and methanol to obtain a photocurable resin having cinnamoyl groups as a light sensitive group.

(iii) photocurable resin having allyl groups as a light sensitive group

The present photocurable resin may, for example, be prepared either by linking allyl glycidyl ether

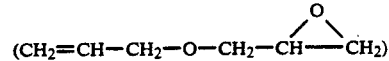

to the acrylic resin of a high acid value used in the above item (i), or by linking a reaction product of (meth)allyl alcohol with a diisocyanate compound to the hydroxyl group-containing acryl resin of a high acid value.

The addition reaction of the above acrylic resin of a high acid value with allyl glycidyl ether may be carried out in the same manner as described in the above item (i).

Further, the light sensitive electrodeposition coating composition of this invention may be a cationic electrodeposition coating composition wherein a usually known cationic resin is used in place of the anionic resin as the photocurable resin (A).

Examples of the cationic resin include, for example, a resin obtained by linking to a hydroxyl group and a tertiary amino group-containing acrylic resin a reaction product of the hydroxyl group-containing polymerizable unsaturated compound and the diisocyanate compound; a tertiary amino group containing resin obtained by reacting the residual epoxy group after the reaction of an epoxy resin with a secondary amine with a polymerizable unsaturated monocarboxylic acid or a hydroxyl group-containing unsaturated compound; a tertiary amino group-containing resin obtained by reacting a polymerizable unsaturated monocarboxylic acid or a hydroxyl group-containing polymerizable unsaturated compound with a resin obtained by copolymerizing a glycidyl group-containing unsaturated compound and a tertiary amino group-containing unsaturated compound with another polymerizable unsaturated monomer; an onium salt-containing resin obtained by reacting an epoxy resin with a polymerizable unsaturated monocarboxylic acid or a hydroxyl group-containing unsaturated compound, and then reacting the residual epoxy groups with a tertiary amino compound, thioether, phosphine or the like in the presence of a carboxylic acid. These resins may be used alone or in a mixture of two or more.

(B) Sensitizer

The Sensitizer (B) to be used in the composition for visible light sensitive electrodeposition coating of this invention is a compound which may be excited by absorption of light in the wavelength region of 400 to 700 nm (visible light) and may interact with the above photocurable resin (A) and the later-described water-insoluble polymerization initiator (C). Examples of the sensitizer (B) include, for example, thioxanthene, xanthene, ketone, thiopyrylium salt, basestyryl, merocyanine, 3-substituted coumalin, cyanine, acridine and thiazine dyes. The term "interaction" includes energy transfer, electron transfer and the like from the excited sensitizer (B) to the photocurable resin (A) or the water-insoluble polymerization initiator (C).

It is difficult to strictly prescribe the amount of the sensitizer (B) to be used because it varies depending, for example, on the kind of the sensitizer (B) and the kind of the photocurable resin and/or the water-insoluble polymerization initiator (C) as objects of interaction. However, it is generally suitable that the amount of the sensitizer (B) falls within 0.1 to 10, preferably 0.3 to 5 weight parts, per 100 weight parts of solid content of the resin (A). If the amount of the sensitizer (B) is less than 0.1 weight part, light sensitivity of the formed film is lowered, whereas if the amount is more than 10 weight parts, it tends to become difficult to maintain the sensitizer in a uniform state in the composition.

Specific examples of the sensitizer (B) to be used in this invention are as follows:

(i) Xanthene and thioxanthene dyes:

There may be mentioned xanthene or thioxanthene dyes (please refer, for example, to Japanese Laid-Open Patent Publication No. 31848/1987) represented by the formula

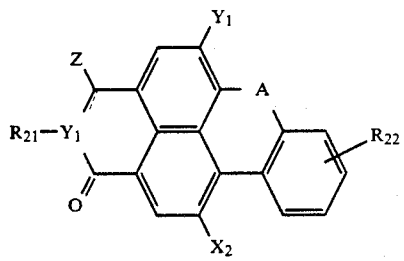

wherein A is an oxygen or sulfur atom; $X_1$ and $X_2$ are independently a hydrogen atom or halogen atom such as chlorine or bromine; $Y_1$ is a carbon or nitrogen atom provided that when $Y_1$ is a carbon atom, the bond between this atom and the adjacent carbon atom (the dotted point) is a double bond, and when $Y_1$ is a nitrogen atom, the bond between this atom and the adjacent carbon is a single bond; Z is an oxygen atom (in this case, the bond between this atom and the adjacent carbon atom is a double bond), a lower alkoxy group or a lower alkanoyloxy group; $R_{21}$ is a lower alkyl, hydroxy lower alkyl, lower alkoxy lower alkyl, dilower alkylamino lower alkyl or aryl group; $R_{22}$ is a lower alkoxy or dilower alkylamino group.

(ii) Ketone dyes

There may be mentioned ketone dyes represented by the formula:

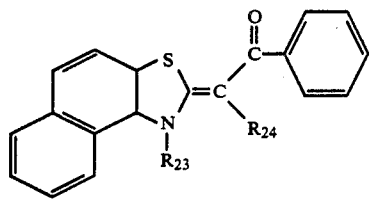

wherein $R_{23}$ represents a lower alkyl group such as methyl or ethyl, and $R_{24}$ represents a hydrogen atom or

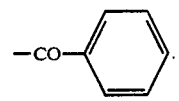

(iii) Thiopyrylium salt dyes

There may be mentioned pyrylium salts or thiopyrylium salts represented by the formula:

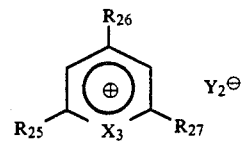

wherein R $R_{25}$, $R_{26}$ and $R_{27}$ independently represent a hydrogen atom, halogen atom, alkyl group, haloalkyl group, ethylenyl group, styryl group, alkoxy group, phenyl group, naphthyl group, alkylphenyl group, alkoxyphenyl group, hydroxyphenyl group, halophenyl group, nitrophenyl group, aminophenyl group, nitro group, amino group or hydroxyl group; $X_3$ represents an oxygen or sulfur atom; and $Y_2^{\ominus}$ represents an anionic functional group. Examples of the anionic functional group represented by $Y_2$ include, for example, perchlorate, fluoroborate, chloroaluminate, chloroferrate, sulfuracetate, methosulfate, fluoroantimonate, thiocyanate, etc. (please refer, for example, to Japanese Laid-Open Patent Publication No. 213838/1986).

(iv) Basestyryl dyes There may be mentioned basestyryl dyes represented by the formula:

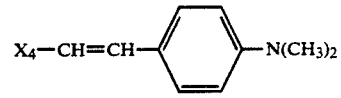

wherein $X_4$ represents a heterocyclic ring such

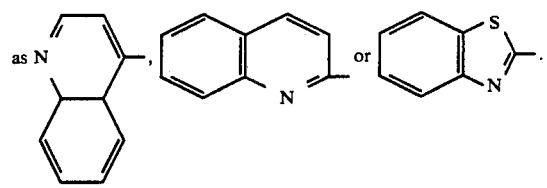

(v) Merocyanine dyes

There may be mentioned merocyanine dyes (please refer, for example, to Japanese Laid-Open Patent Publication No. 213838/1986) represented by the following formulae (1) to (3):

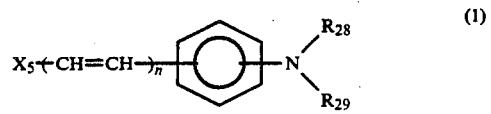

(1)

wherein $R_{28}$ and $R_{29}$ independently represent a hydrogen atom or an alkyl group having 1 to 4 carbon atoms, n represents an inteer of 1 to 3, and $X_5$ represents

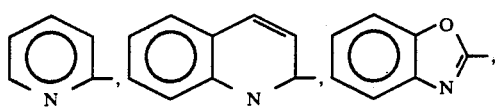
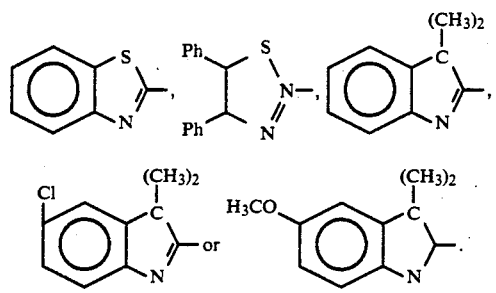
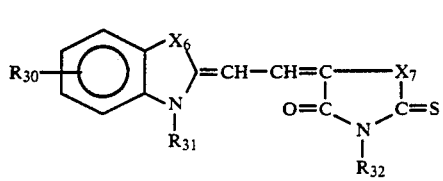

wherein $X_6$ and $X_7$ independently represent a sulfur atom, an oxygen atom or

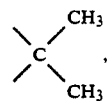

and $R_{30}$, $R_{31}$ and $R_{32}$ independently represent a hydrogen atom, an alkyl group having 1 to 6 carbon atom or an aryl group.

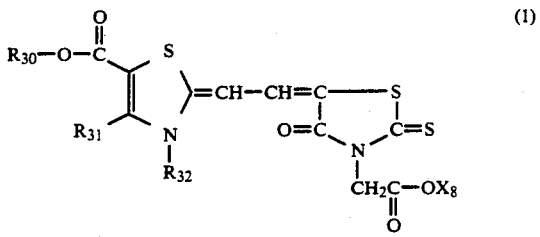

wherein $R_{30}$, $R_{31}$ and $R_{32}$ independently represent a hydrogen atom, alkyl group having 1 to 6 carbon atoms or an aryl group, and $X_8$ represents a hydrogen atom or an alkali metal.

(vi) 3-Substituted coumalins

There may be mentioned 3-substituted coumalins represented by the following structures (please refer to Japanese Laid-Open Patent Publication No. 97650/1876):

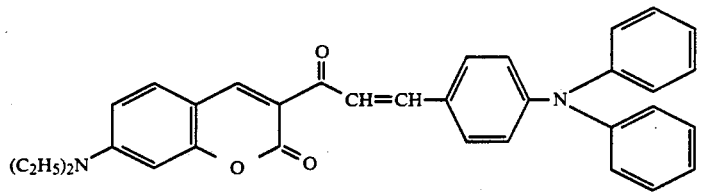
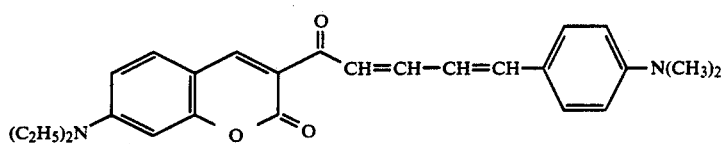
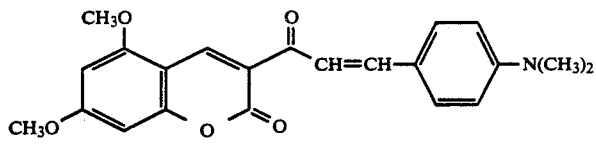
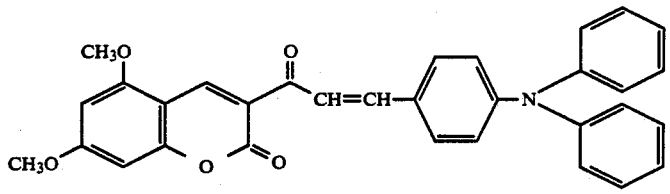
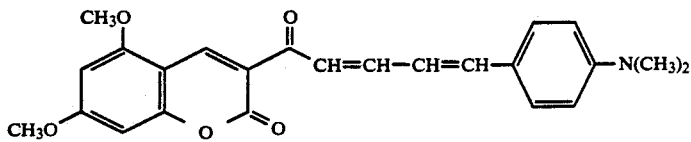

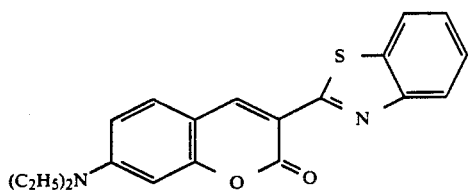
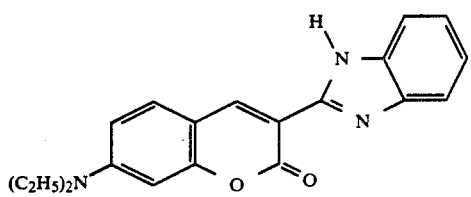
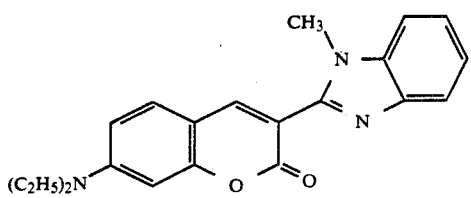
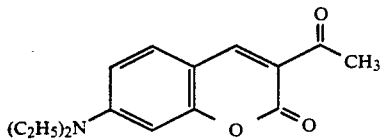
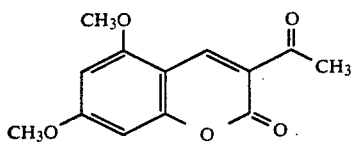
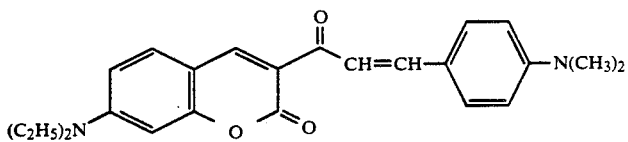
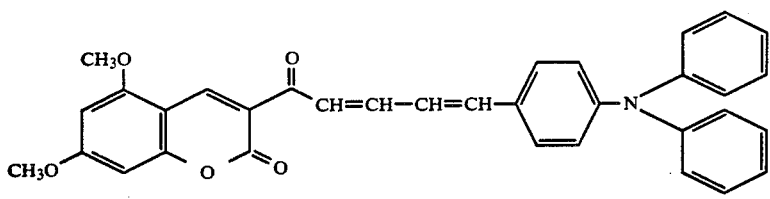
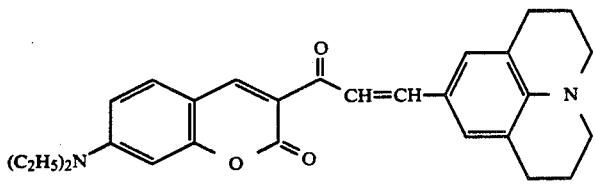
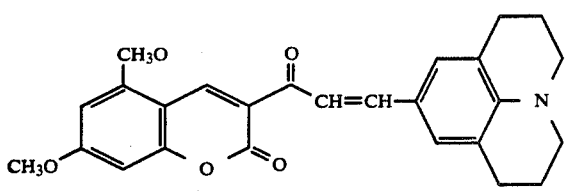

-continued
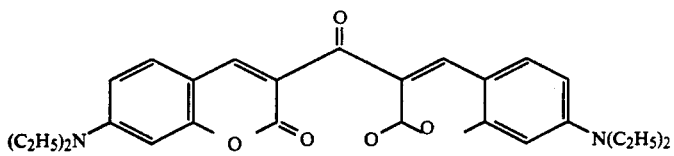
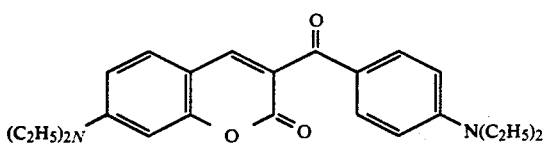
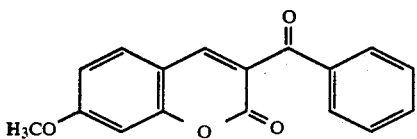
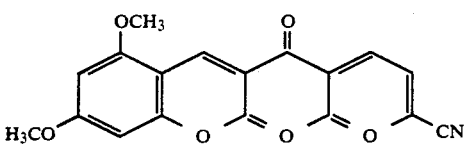
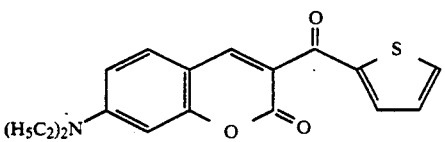
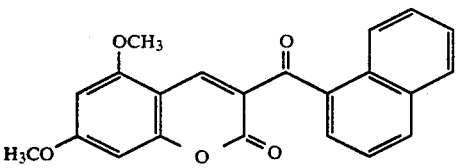
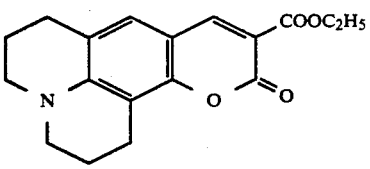
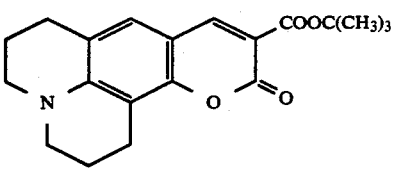
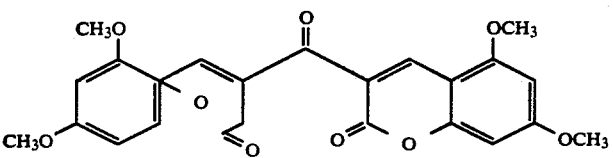

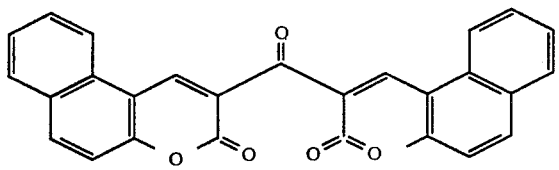

(vii) Cyanine dyes

There may be mentioned cyanine dyes (please refer to Japanese Laid-Open Patent Publication No. 213838/1986) represented by the following formulae (1) to (3):

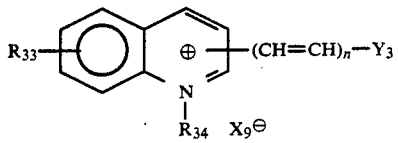
(1)

wherein $R_{33}$ represents a hydrogen atom, alkyl group having 1 to 6 carbon atoms, aryl group, alkoxy group or dialkylaino group, $R_{34}$ represents a hydrogen atom, alkyl group having 1 to 10 carbon atoms or aryl group, $X_9$ represents a halogen atom, n represents an integer of 1 to 3, and $Y_3$ represents

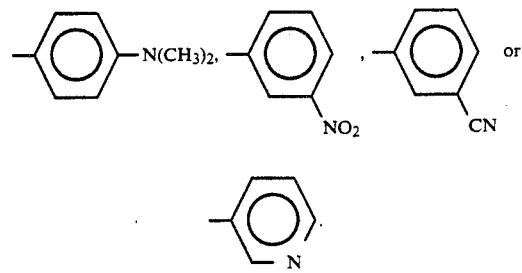

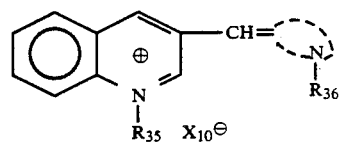
(2)

wherein $R_{35}$ and $R_{36}$ independently represent a hydrogen atom, alkyl group having 1 to 10 carbon atoms or aryl group, $X_{10}$ represents a halogen atom, and

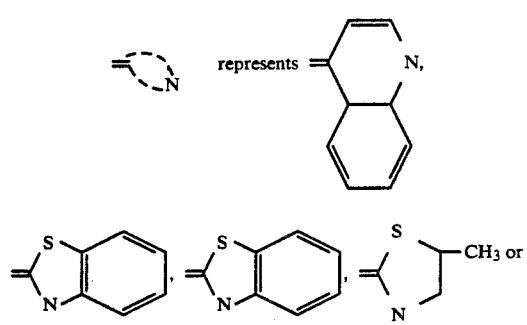

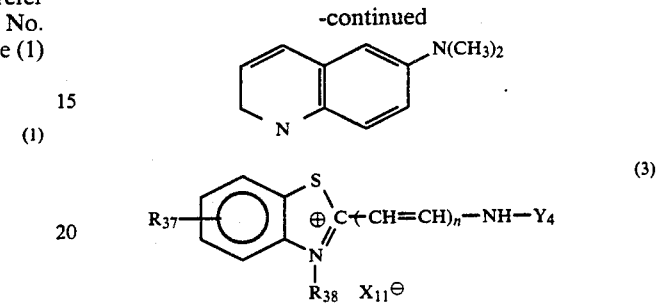
(3)

wherein $R_{37}$ represents a hydrogen atom, alkyl group having 1 to 6 carbon atoms, aryl group or alkoxy group, $R_{38}$ represents a hydrogen atom, alkyl group having 1 to 10 carbon atoms or aryl group, $X_{11}$ represents a halogen atom, n represents an integer of 1 to 3, and $Y_4$ represents

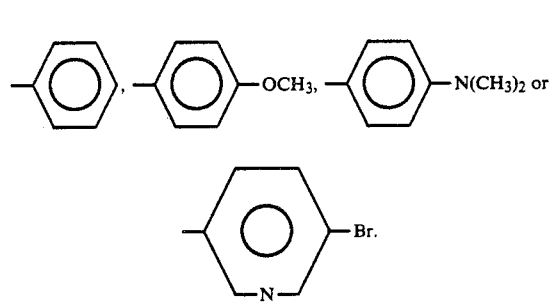

(C) Water-insoluble polymerization initiator

The visible light sensitive electrodeposition coating composition of this invention contains a water-insoluble polymerization initiator. This initiator is decomposed by application of light and starts the cross-linking or polymerization reaction of the light sensitive groups of the above photopolymerizable resin.

There may be used as the polymerization initiator a substance which is decomposed by excitation with light, either alone per se or by the interaction with the hereinbefore-stated sensitizer, more detailedly a compound which generates a group active to the crosslinking or polymerization reaction of the light sensitive groups, either by cleavage reaction of itself or by hydrogen abstraction reaction from another molecule. In this invention, such a polymerization initiator may particularly be a substantially water-insoluble polymerization initiator, for example, one which has a solubility in water of 2 g/100 ml or less. Such a water-insoluble polymerization initiator effectively deposits during electrodeposition and is introduced into the resulting film, which makes the film highly sensitive.

Specific examples of the polymerization initiator include the following compounds:

aromatic carbonyl compounds such as benzophenone, benzoin methyl ether, benzoin isopropyl ether, benzil, xanthone, thioxanthone and anthraquinone;

acetophenones such as acetophonone, propiophenone, alpha-hydroxyisobutylphenone, alpha,alpha'-dichloro-4-phenoxyacetophenone and 1-hydroxy-1-cyclohexylacetophenone;

organic peroxides such as benzoyl peroxide, tertiary-butyl peroxybenzoate, tertiary-butyl peroxy2-ethyl-hexanoate, tertiary-butyl hydroperoxide, ditertiary-butyl diperoxyisophthalate and 3,3',4,4'-tetra(tertiary-butyl peroxycarbonyl)benzophenone;

diphenylhalonium salts such as diphenyliodonium bromide and diphenyliodonium chloride;

organic halides such as carbon tetrachloride, carbon tetrabromide, chloroform and iodoform;

heterocyclic and polycyclic compounds such as 3-phenyl-5-isoxazolone and 2,4,6-tris(trichloromethyl)1,3,5-triazinebenzanthorone;

azo compounds such as 2,2'-azobis(2,4-dimethylvaleronitrile), 2,2'-azobisisobutyronitrile, 1,1'-azobis(cyclohexane-1-carbonitrile) and 2,2'-azobis(2-methylbutyronitrile);

iron-arene complexes (please refer to European Patent No. 152377);

titanocene compounds (please refer to Japanese Laid-Open Patent Publication No. 221110/1988); and the like.

Among the above water-insoluble polymerization initiators, ditertiary-butyl, diperoxyisophthalate, 3,3',4,4'-tetra(tertiary-butyl peroxycarbonyl)benzophenone, iron-arene complexes and titanocene compounds are preferred compounds due to their high activity to the crosslinking or polymerization.

Above all, iron-arene complexes and titanocene compounds exhibit a very high light sensitive property and at the same time have no danger of explosively decomposing by friction, impact or the like, which is different from the case of peroxide polymerization initiators. Thus, when the electrodeposition coating bath solution is circulated in a pipeline with a pump over a long period, iron-arene complexes and titanocene compounds can be advantageously used because there is utterly no danger that the coating which adhered to the rotation axis of the pump, the sliding part of the valves or the like catches fire or explodes by friction, impact or the like due to rotation of the pump, opening or shutting of the valves, or the like. Further, since titanocene compounds per se have an ability to initiate the polymerization with the irradiation of visible light, they can give compositions for visible light sensitive electrodeposition coating having a practical sensitivity without the use of the sensitizer (B). However, light sensitivity is enhanced by the use of a titanocene compound together with the sensitizer (B), and light sensitivity, resolution and the like may still further be improved by further addition of the nitrogen-containing compound (D).

Preferred examples of the above iron-arene complex include, for example, three kinds of complexes represented by the following formulae (I), (II) and (III):

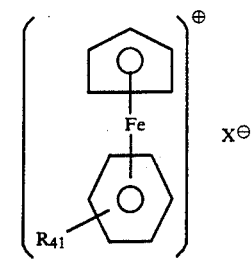

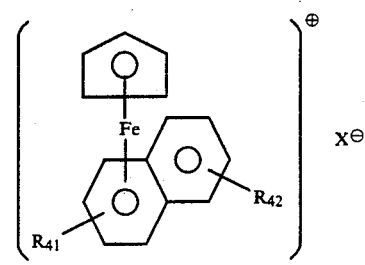

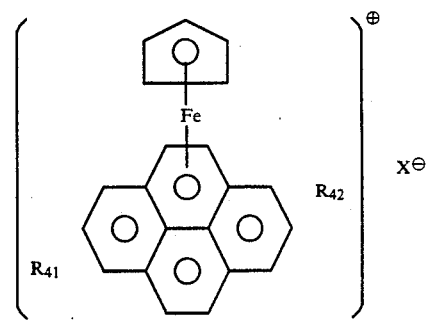

In the above formulae, X represents $BF_4$, $PF_6$, $AsF_6$ or $SbF_6$, and $R_{41}$ and $R_{42}$ independently represent a straight-chained or branched alkyl group having 1 to 6 carbon atoms such as $-CH_3$, $-C_2H_5$,

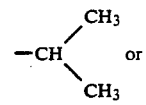

$-CH_2CH_2CH_2CH_3$.

Preferred examples of the above titanocene compound include those represented by the following general formula (IV):

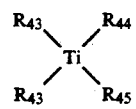

wherein two $R_{43}$ substituents independently represent a cyclopendadienyl group optionally substituted with one or two of methyl groups, preferably a cyclopentadienyl or methylcyclopentadienyl group, and $R_{44}$ and $R_{45}$ independently represent the following formula:

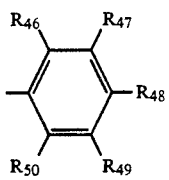

wherein $R_{46}$ represent a fluorine atom —$CF_3$ or —$CF_2CH_3$, and $R_{47}$, $R_{48}$, $R_{49}$ and $R_{50}$ independently represent a fluorine atom, —$CF_3$, —$CF_2CH_3$, a hydrogen atom, an alkyl group having 1 to 12 carbon atoms or an alkoxy group.

Specific examples of the above titanocene compounds include, for example,

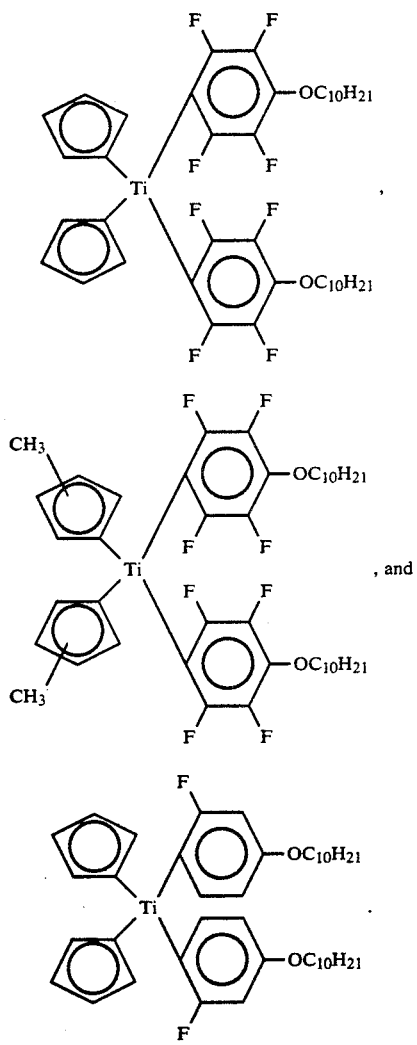

, and

Although the amount of the polymerization initiator to be used is not critical and may widely be varied depending on its kind and the like, the amount may generally range from 0.1 to 25, preferably 0.2 to 10 weight parts, per 100 weight parts of solid content of the above photocurable resin (A). If the polymerization initiator is used in an amount more than 25 weight parts, the stability of the obtained composition tends to be lowered.

(D) Nitrogen-containing compound

When the nitrogen-containing compound represented by one of the formulae (1) to (6) is compounded in the composition for visible light sensitive electrodeposition coating of this invention, the sensitizing effect of the sensitizer (B) is improved and as a result, the resulting composition becomes very highly sensitive and at the same time the resolution of an image obtained using this composition is also improved.

Although the reason why the above effects are brought about is not certain, it is considered that the nitrogen-containing compound (D) interacts with the sensitizer (B) to change the excitated state of the sensitizer, which has an influence on the improvement of light sensitivity of the composition. Further, as for the improvement of the resolution the following reason is considered. Namely, since the nitrogen-containing compound (D) has a strong ability to form a chelate with a metal ion such as copper ion, it inhibits the reaction between the metal ions dissolved out during electrodeposition coating and the ionic groups such as carboxyl groups in the photocurable resin (A), and as a result, inhibits that the deposited resin becomes higher in molecular weight or is crosslinked by the operation of the metal ions. As a result, the alkali solubility of the unexposed areas at the time of image formation is maintained, the difference in solubility between the exposed area and unexposed area becomes larger, and thus the resolution is improved.

Benzotriazoles such as

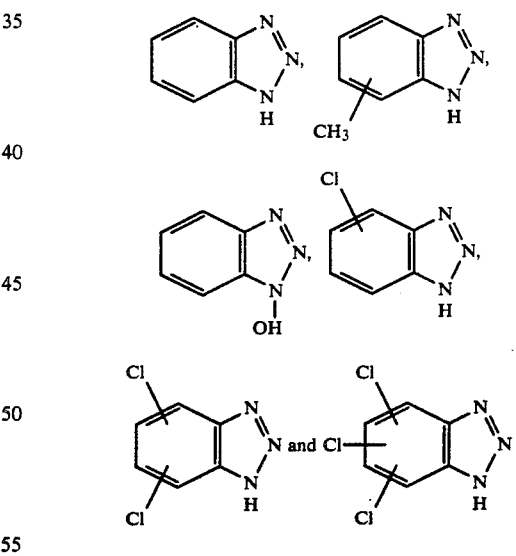

may be mentioned as examples of the nitrogen-containing compound (D) represented by the general formula (1).

Pyrazoles such as

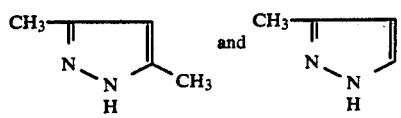

may be mentioned as examples of those represented by the general formula (2).

Examples of those represented by the general formula (3) may include

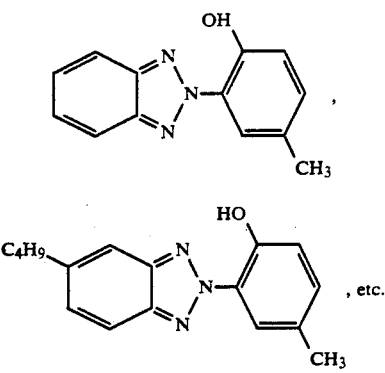

Examples of those represented by the general formula (4) may include

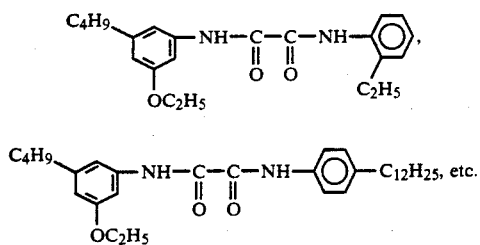

Examples of those represented by the general formula (5) may include

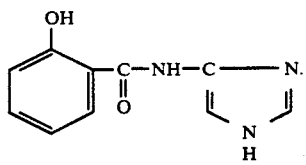

Examples of those represented by the general formula (6) may include

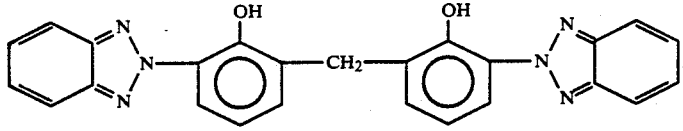

Among examples of the nitrogen-containing compound (D) in this invention benzotriazoles represented by the above general formula (1) are particularly preferred.

The nitrogen-containing compound (D) may be used alone or in combination of one or two or more in the composition for electrodeposition coating of this invention, and the amount thereof to be used ranges from 0.01 to 20, preferably 0.1 to 10 weight parts, per 100 weight parts of solid content of the photocurable resin (A).

(E) Other components

It is also possible, if necessary, in order to suitably adjust the performance of the film formed using the composition for electrodeposition coating of this invention to compound therein besides the above photocurable resin (A) a polymerizable unsaturated group-containing resin such as a polyester acrylate resin having ethylenic unsaturated groups, polyurethane resin, epoxy resin or acrylic resin; a vinyl monomer such as a (meth)acrylic ester; an oligomer such as diethylene glycol di(meth)acrylate; or the like in the range of usually 100 weight parts or less, preferably 50 weight parts or less per 100 weight parts of solid content of the photocurable resin (A).

Preparation of the composition for visible light sensitive electrodeposition coating The composition for light sensitive electrodeposition coating of this invention may be prepared, for example, by compounding the sensitizer (B), the polymerization initiator (C), the nitrogen-containing compound (D) and another component (E) to a water dispersed or water solubilized photocurable resin (A).

The water dispersion or water solubilization of the photocurable resin (A) may be made by neutralizing the resin (A) with an alkali (a neutralizing agent) when the resin (A) has an anionic group such as a carboxylic group, or by neutralizing the resin (A) with an acid (a neutralizing agent) when a cationic group such as an amino group is introduced therein. Examples of the alkali as the neutralizing agent include, for example, alkanolamines such as monoethanolamine, diethanolamine and triethanolamine; alkylamines such as triethylamine, diethylamine, monoethylamine, diisopropylamine, trimethylamine and diisobutylamine; alkylalkanolamines such as dimethylaminoethanol; alicyclic amines such as cyclohexylamine; alkali metal hydroxides such as sodium hydroxide and potassium hydroxide; ammonia; etc. Examples of the acid as the neutralizing agent include, for example, monocarboxylic acids such as formic acid, acetic acid, lactic acid and butyric acid. These neutralizing agents may be used alone or in combination. It is preferred that the amount of the neutralizing agent to be used ranges generally from 0.2 to 1.0, preferably 0.3 to 0.8 equivalent, per mole of the ionic group contained in the resin (A).

There may be added, if necessary, to the above photocurable resin (A) a hydrophilic solvent such as methanol, ethanol, isopropanol, n-butanol, t-butanol, methoxyethanol, ethoxybutanol, butoxyethanol, diethylene glycol, methyl ether, dioxane or tetrahydrofuran for the water-solubilizing or water-dispersing purpose or in order to further enhance the fluidity of the resin component. The amount of the hydrophilic solvent to be used may generally be up to 300 weight parts, preferably up to 100 weight parts, per 100 weight parts of solid content of the resin (A).

Further, in order to make larger the coated amount to a material to be coated, it is also possible to add to the above photocurable resin (A) a hydrophobic solvent, for example, a petroleum series solvent such as toluene or xylene; a ketone such as methyl ethyl ketone or methyl isobutyl ketone; an ester such as ethyl acetate or butyl acetate; an alcohol such as 2-ethylhexyl alcohol or benzyl alcohol; or the like. The amount of the hydrophobic solvent to be compounded may usually be up to 200 weight parts, preferably 100 weight parts or less, per 100 weight parts of solid content of the resin (A).

The above solvent may also be used besides the above purpose as a solvent to dissolve the sensitizer (B), the polymerization initiator (C) and the nitrogen-containing compound (D).

When the sensitizer (B), the polymerization initiator (C) and the nitrogen-containing compound (D) are hard to dissolve in the resin solution after the neutralization, it is desirable that these components are previously dissolved in a suitable hydrophilic or hydrophobic solvent and then mixed with the resin (A). The solvent to be used may be selected from the above-mentioned solvents, and it is adequate that the amount thereof to be used is an amount such that the sensitizer (B), the polymerization initiator (C) and the nitrogen-containing compound (D) may be dissolved.

Preparation of the composition for electrodeposition coating may be carried out according to a process which has hitherto been known, for example by adequately mixing the resin (A) water-solubilized by the above neutralization, the sensitizer (B), the polymerization initiator (C), the nitrogen-containing compound (D) and another component (E) and then adding water.

The thus prepared composition may be diluted with water according to a usual method to obtain an electrodeposition coating (or a coating bath) having, for example, a pH in the range of 4 to 9 and a bath concentration (i.e. solid content concentration) in the range of 3 to 25, preferably 5 to 15 weight %.

Electrodeposition coating and formation of an image

The thus prepared electrodeposition coating may be applied onto the surface of a conductor as a material to be coated. There may be used as the conductor an electrically conductive material such as a metal, carbon or tin oxide, or a plastic or glass surface having fastened thereon the electrically conductive material, for example, by laminating or plating.

The temperature of the bath is controlled at 15 to 40° C., preferably 15° to 30° C., and the pH and the bath concentration are controlled in the above-described range. Then, the conductor to be coated is immersed in the thus controlled electrodeposition coating bath, either as an anode when the electrodeposition coating is an anion type, or as a cathode when the electrodeposition coating is a cation type, and a direct current of 5 to 200 V is given. The time to be electrified is suitably 30 seconds to 5 minutes, and the thickness of the film to be obtained is as dry film thickness generally 0.5 to 50 micrometers, preferably 1 to 10 micrometers.

After the electrodeposition coating, the coated material is drawn up from the electrodeposition bath, washed with water and dried with hot air or the like to remove the water contained in the electrodeposition film.

Further, if necessary, a cover coat layer may be provided on the electrodeposition film by a known per se process (please refer, for example, to Japanese Laid-Open Patent Publication No. 60594/1988).

The resulting visible light sensitive electrodeposition film formed on the conductor surface is exposed directly to visible light to cause curing, and then the unexposed areas of the film is removed by a development to form the image on the conductor.

There may be used as a light source for exposure rays of the visible region obtained by cutting ultraviolet rays with a ultraviolet cutting filter from the rays from a light source such as an extra-high, high, medium or low pressure mercury lamp, a chemical lamp, a carbon arc lamp, a xanon lamp, a metal halide lamp, a fluorescent lamp, a tungsten lamp or sunlight; a laser having the emission of radiation in the visible region.

The development may be carried out by washing away the film of the unexposed areas either using an aqueous alkali solution when the electrodeposition coating is an anionic type, or using an aqueous acid solution of a pH of 5 or less when the electrodeposition coating is a cationic type.

There may usually be used as the aqueous alkali solution one capable of giving the film water solubility by neutralizing the free carboxylic acids contained in the film, such as an aqueous solution of sodium hydroxide, sodium carbonate, potassium hydroxide or ammonia. Further, there may usually be used as the aqueous acid solution acetic acid, formic acid or the like.

The film after the development is washed with water and dried with hot air or the like, whereby the desired image is formed on the conductor. Further, if necessary, it is possible that etching is carried out, the exposed parts of the conductor is removed, and the resist film is removed to prepare a printed circuit board.

The composition for electrodeposition coating and image-forming method using the composition of this invention are applicable to various uses such as photoresist, plate materials for lithography and letterpress, PS plates for offset printing, materials for information recording and materials for preparation of relief images.

There may be obtained a uniform, smooth and visible light sensitive film of any film thickness by applying the composition for electrodeposition coating of this invention by electrodeposition. Since no high technique is required for formation of the film, workability is greatly enhanced compared to the usual film-forming methods. Further, there are effects including that a thin film, which has not been attained by a liquid coating or a light sensitive film, may easily be obtained only by arranging the electrodeposition condition, and moreover the image obtained by exposure to light is very much clear compared to the usual images. Further, the composition for electrodeposition coating of this invention has a smaller harmfulness to human bodies and a smaller danger of fire compared to the usual liquid coatings or films because the amount of organic solvents used is smaller. Further, since the composition for electrodeposition coating of this invention has a high sensitivity to visible light laser such as argon ion laser having the emission of radiation at 488 nm, it has an advantage that high speed scanning exposure using such a laser becomes possible.

This invention is further specifically described below by examples, wherein "part" and "%" represent weight part and weight %, respectively.

Synthetic example 1 of a photocurable resin

A liquid mixture consisting of 40 parts of methyl methacrylate, 40 parts of butyl acrylate, 20 parts of acrylic acid and 2 parts of azobisisobutyronitrile was added dropwise to 90 parts of propylene glycol monomethyl ether (a hydrophilic solvent) maintained at 110° C. under a nitrogen gas atmosphere over 3 hours. After the dropwise addition, the mixture was aged for one hour, and a liquid mixture consisting of one part of azobisdimethylvaleronitrile and 10 parts of propylene glycol monomethyl ether was added dropwise over one hour, followed by 5 hours' adding to obtain a solution of an acrylic resin of a high acid value (acid value 155). Then a reaction was carried out at 110° C. for 5 hours adding to this solution 24 parts of glycidyl methacrylate, 0.12 part of hydroquinone and 0.6 part of tetraethylammonium bromide and blowing air therein to obtain a solution of a photocurable resin (acid value about 50, unsaturation degree 1.35 moles/kg, Tg point 20° C., number average molecular weight about 20,000).

Synthetic example 2 of a photocurable resin

A liquid mixture consisting of 60 parts of styrene, 10 parts of methyl acrylate, 30 parts of acrylic acid and 3 parts of azobisisobutyronitrile was added dropwise to 90 parts of Cellosolve maintained at 120° C. under a nitrogen gas atmosphere over 3 hours. After the dropwise addition, the mixture was aged for one hour, a liquid mixture consisting of one part of azobisdimethylvaleronitrile and 10 parts of Cellosolve was added dropwise over one hour, and the mixture was aged for 5 hours to obtain a solution of an acrylic resin of a high acid value (acid value 233). A reaction was carried out at 110° C. for 5 hours adding to this solution 35 parts of glycidyl methacrylate, 0.13 part of hydroquinone and 0.6 part of tetraethylammonium bromide and blowing air therein to obtain a solution of a photocurable resin (acid value about 70, unsaturation degree 1.83 moles/kg, Tg point 45° C., number average molecular weight about 15,000).

Synthetic example 3 of a photocurable resin

A liquid mixture consisting of 25 parts of methyl methacrylate, 15 parts of n-butyl acrylate, 15 parts of n-butyl acrylate, 15 parts of acrylic acid, 45 parts of 2-hydroxyethyl methacrylate and 2 parts of azobisisobutyronitrile was added dropwise to 100 parts of DMF maintained at 80° C. under a nitrogen gas atmosphere over 3 hours. After the dropwise addition, the mixture was aged for one hour, and a liquid mixture consisting of one part of azobisdimethylvaleronitrile and 5 parts of DMF (dimethylformamide) was added dropwise over one hour, followed by aging for 5 hours to obtain a solution of an acrylic resin of a high acid value (acid value 115).

Pyridine (120 parts) was added to 200 parts of this polymerization solution, and 57 parts of cinnamoyl chloride dissolved in 150 parts of DMF was added dropwise at 10° C. or less, followed by stirring at 50° C. for 4 hours. The reaction solution was poured in 500 parts of methanol to precipitate the resulting polymer, this polymer was reprecipitated with THF (tetrahydrofuran)water and then further reprecipitated with THF-methanol to purify it, and then dried at room temperature under reduced pressure. The obtained photocurable resin having cinnamoyl groups as a light sensitive group had the acid value of 81, the Tg point of 51° C., the number average molecular weight of about 20,000 and the amount of cinnamoyl groups of 3.69 moles/kg.

A solution of 100 parts of this resin in a mixture solvent of 50 parts of propylene glycol methyl ether and 50 parts of n-butanol was used.

Synthetic example 4 of a photocurable resin

A liquid mixture consisting of 38 parts of methyl methacrylate, 38 parts of butyl acrylate, 24 parts of acrylic acid and 2 parts of azobisisobutyronitrile was added dropwise to 90 parts of propylene glycol monomethyl ether (a hydrophilic solvent) maintained at 110° C. under a nitrogen gas atmosphere over 3 hours. After the dropwise addition, the mixture was aged for one hour, and liquid mixture consisting of one part of azobisdimethylvaleronitrile and 10 parts of propylene glycol monomethyl ether was added dropwise over one hour, followed by aging for 5 hours to obtain a solution of an acrylic resin of a high acid value (acid value 155). Then a reaction was carried out at 110° C. for 5 hours adding to this solution 30 parts of allyl glycidyl ether, 0.12 part of hydroquinone and 0.6 part of tetraethylammonium bromide and blowing air therein to obtain a solution of a photocurable resin (acid value about 54, unsaturation degree 1.51 moles/kg, Tg point 25° C., number average molecular weight about 18,000).

Synthetic example 5 of a photocurable resin

A polymerization was carried out at 110° C. in 90 parts of n-butyl alcohol using 20 parts of methyl methacrylate, 60 parts of acrylic acid, 20 parts of methacrylic acid and 6 parts of t-butyl peroxyoctoate. 114 parts of glycidyl methacrylate, 0.24 part of hydroquinone and 1.0 part of tetraethylammonium bromide were added thereto, and a reaction was carried out in the same manner as in Synthetic example 1 to obtain a solution of a photocurable resin (acid value 70, unsaturation degree 3.75 moles/kg, Tg point 8° C., number average molecular weight 18,000).

Synthetic example 6 of a photocurable resin

A liquid mixture consisting of 30 parts of glycidyl methacrylate, 5 parts of styrene, 24 parts of n-butyl methacrylate, 23 parts of methyl acrylate, 18 parts of dimethylaminoethyl methacrylate and 5 parts of azobisisovaleronitrile was added dropwise to 90 parts of Cellosolve maintained at 80° C. under a nitrogen gas atmosphere over 3 hours. After the dropwise addition, the mixture was aged for one hour, and a liquid mixture consisting of one part of azobisdimethylvaleronitrile and 10 parts of Cellosolve was added thereto over one hour, followed by aging for further 5 hours to obtain an acrylic resin solution. A solution was carried out at 110° C. for 5 hours adding to this solution 15 parts of acrylic acid and 0.13 part of hydroquinone and blowing air therein to obtain a solution of a photocurable resin (amine value 56, unsaturation equivalent 1.83 moles/kg, Tg 10° C., number average molecular weight about 15,000).

EXAMPLE 1

Triethylamine (6 parts) was added to 100 parts of the photocurable resin (as solid content) obtained in Synthetic example 1 to adequately neutralize the resin, a solution of one part of sensitizer A-1

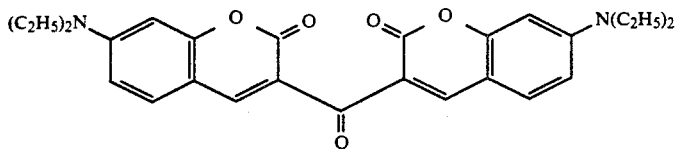

in 10 parts of a solvent (benzyl alcohol) was added thereto, followed by adequate mixing, and then 7 parts of a radical generator (ditertiary-butyl diperoxyisophthalate) was added, followed by mixing. A deionized water was then added to adjust the solid content concentration to 15 %, whereby an electrodeposition coating bath (pH 6.5) was obtained.

Electrodeposition coating was carried out by giving this electrodeposition coating bath a direct current of 45 mA/cm² at the bath temperature of 25° C. for 3 minutes using a copper-clad laminate for print wiring (40×150×0.8 mm) as an anode. The obtained electrodeposition film was washed with water and dried at 80° C. for 5 minutes to obtain a non-sticking and smooth light sensitive film having a thickness of 12 micrometers. This light sensitive film was irradiated with light using a spectral irradiation apparatus (a diffraction grating type spectroscope made by K. K. NARUMI SHOKAI), and then developed for one minute using an aqueous 1 % sodium carbonate solution of 30° C. to form an image. The light sensitive film was exposed to light using the spectral irradiation apparatus, developed with an aqueous 1 % sodium carbonate solution for one minute and water-washed. Then, the lowest exposing energy wherein a cured film can remain at the wavelength of 488 nm was determined as its sensitivity. The results are shown in Table 1.

EXAMPLES 2 TO 24

Electrodeposition coating baths were prepared in the same manner as in Example 1 except for using the photocurable resins, sensitizers, polymerization initiators and nitrogen-containing compounds shown in Table 1, and then images were formed. Sensitivities thereof are shown in Table 1.

EXAMPLE 25

The photocurable resin (100 parts as solid content) obtained in Synthetic example 7 was neutralized with 3.6 parts of acetic acid, a solution of one part of sensitizer A-1 and 5 parts of 3,3',4,4'-tetra(t-butyl peroxycarbonyl)benzophenone in 10 parts of benzyl alcohol was added and mixed, and then deionized water was added to adjust the solid content concentration to 15 %, whereby an electrodeposition coating bath (pH 6.4) was obtained.

Electrodeposition coating was carried out by giving this electrodeposition coating bath a direct current of 45 mA/cm² at the bath temperature of 25° C. for 3 minutes using a copper-clad laminate for print wiring (40×150×0.8 mm) as a canode. The obtained electrodeposition film was washed with water and dried at 80° C. for 5 minutes to obtain a non-sticking and smooth light sensitive film having a film thickness of 12 micrometers. This light sensitive film was irradiated with light using a spectral irradiation apparatus (a diffraction grating type spectroscope made by K. K. NARUMI SHOKAI), and then developed for one minute using an aqueous 2 % lactic acid solution of 30° C. to form an image. The light sensitive film was exposed to light using the spectral irradiation apparatus, developed with an aqueous 2 % lactic acid solution for one minute and water-washed. Then, the lowest exposing energy wherein a cured film can remain at an wavelength of 488 nm was determined as its sensitivity. The results are shown in Table 1.

EXAMPLES 26 TO 30

The procedure of Example 25 was repeated except for using the polymerization initiators and nitrogen-containing compounds shown in Table 1 to prepare electrodeposition coating baths, and then images were formed using these baths. Sensitivities thereof are shown in Table 1.

TABLE 1

| Example | Photocurable resin Synthetic example | Parts * | Sensitizer Kind | Parts | Solvent | Parts | Polymerization initiator Kind | Parts | Nitrogen containing compound Kind | Parts | Sensitivity (mJ/cm²) |
|---|---|---|---|---|---|---|---|---|---|---|---|
| 1 | 1 | 100 | A-1 | 1 | Benzyl alcohol | 10 | PBIF | 7 | — | | 3.2 |
| 2 | Same as above | | A-1 | 1.5 | Same as above | | MK BP | 9.7 6.6 | — | | 5.4 |
| 3 | Same as above | | A-1 | 0.7 | Dioxane Benzyl alcohol | 10 10 | DIB | 10 | — | | 10.2 |
| 4 | Same as above | | A-1 | 1 | Benzyl alcohol | 10 | MK Carbon tetrachloride | 9.7 5.6 | — | | 5.9 |
| 5 | Same as above | | Same as above | | Butyl Cellosolve Benzyl alcohol | 10 10 | DETX I-907 | 2 5 | — | | 7.1 |
| 6 | 2 | 100 | Same as above | | Benzyl alcohol | 10 | BTTB | 9 | — | | 2.8 |
| 7 | 1 | 100 | A-2 | 3 | Same as above | | PBIF | 4 | — | | 5.4 |
| 8 | 1 | 100 | A-3 | 3 | Benzyl alcohol | 10 | PBIF | 4 | — | | 11.2 |
| 9 | Same as above | | A-4 | 3 | Same as above | | Same as above | | — | | 12.4 |
| 10 | Same as above | | A-5 | 1 | Same as above | | Same as above | | — | | 7.5 |
| 11 | 5 | 100 | A-6 | 3 | Same as above | | Same as above | | N-3 | 5 | 3.5 |
| 12 | 3 | 100 | Same as above | | Same as above | | PBIF | 7 | — | | 3.8 |
| 13 | 4 | 100 | A-1 | 1 | Same as above | | Same as above | | — | | 5.1 |

TABLE 1-continued

| Example | Photocurable resin Synthetic example | Parts* | Sensitizer Kind | Parts | Solvent | Parts | Polymerization initiator Kind | Parts | Nitrogen containing compound Kind | Parts | Sensitivity (mJ/cm$^2$) |
|---|---|---|---|---|---|---|---|---|---|---|---|
| 14 | 2 | 100 | Same as above | | Same as above | | BTTB | 9 | N-1 | 2 | 1.5 |
| 15 | 1 | 100 | Same as above | | Same as above | | PBIF | 7 | N-2 | 2 | 2.0 |
| 16 | Same as above | | A-3 | 3 | Same as above | | PBIF | 4 | N-3 | 2 | 5.5 |
| 17 | 6 | 100 | A-1 | 1 | Benzyl alcohol Butyl Cellosolve | 5 10 | T-1 | 2 | — | | 3.5 |
| 18 | Same as above | | Same as above | | Same as above | | Same as above | | N-1 | 1 | 2.1 |
| 19 | Same as above | | — | | Same as above | | T-1 | 3 | — | | 18.1 |
| 20 | 1 | 100 | A-5 | 0.5 | Benzyl alcohol Dioxane | 10 10 | T-1 | 6 | N-1 | 0.5 | 7.2 |
| 21 | 2 | 100 | A-5 | 1.5 | Butyl Cellosolve Benzyl alcohol | 15 5 | F-1 | 5 | Same as above | | 7.2 |
| 22 | 5 | 100 | A-1 | 2 | Benzyl alcohol | 10 | T-1 BP CHPK | 1 5 5 | N-1 | 1.5 | 2.8 |
| 23 | 2 | 100 | A-1 | 1 | Same as above | | T-1 | 10 | N-1 | 0.5 | 1.3 |
| 24 | 5 | 100 | A-1 | 1 | Benzyl alcohol | 10 | F-1 | 5 | — | | 10.8 |
| 25 | 6 | 100 | A-1 | 1.5 | Same as above | | BTTB | 5 | — | | 5.5 |
| 26 | Same as above | | Same as above | | Same as above | | Same as above | | N-1 | 1.0 | 3.5 |
| 27 | Same as above | | A-5 | 1 | Butyl Cellosolve Benzyl alcohol | 10 5 | F-1 | 3 | N-1 | 1 | 4.1 |
| 28 | Same as above | | Same as above | | Same as above | | Same as above | | — | | 10.6 |
| 29 | Same as above | | A-1 | 1 | Benzyl alcohol | 10 | T-1 | 2 | N-1 | 0.5 | 3.1 |
| 30 | Same as above | | Same as above | | Same as above | | Same as above | | — | | 6.3 |

*represents weight part of solid content.

The symbols and abbreviations in Table 1 have the following meanings.

Sensitizer:

A-1:

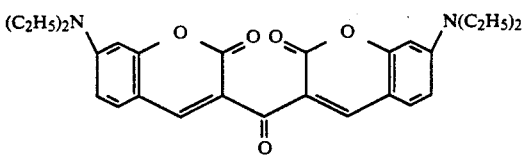

A-2:

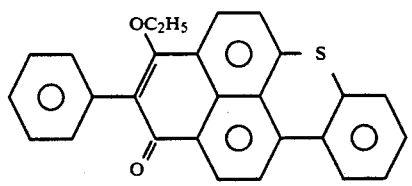

A-3:

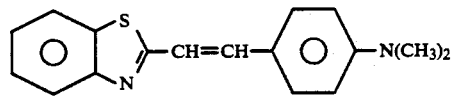

A-4:

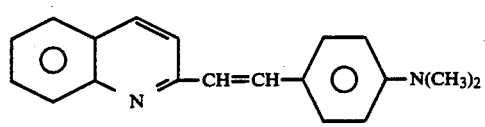

A-5:

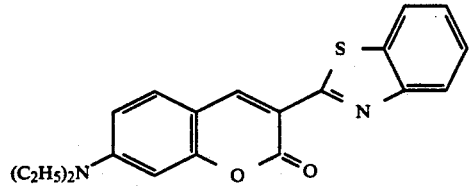

A-6: 3-Methyl-1,3-diazo-1,9-benzanthrone

Polymerization initiator:
PBIF: Ditertiary-butyl diperoxyisophthalate
AZV: 2,2'-Azobis(2,4-dimethylvaleronitrile)
MK: Michler's ketone
BP: Benzophenone
DIB: Diphenyliodonium bromide
DETX: 2,4-Diethylthioxanthone
I-907: Compound represented by structural formula

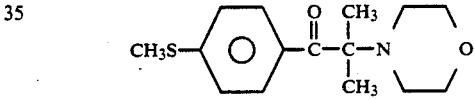

BTTB: 3,3',4,4'-tetra(tertiary-butyl peroxycarbonyl)benzophenone
CHPK: 1-Hydroxycyclohexyl phenyl ketone

T-1:

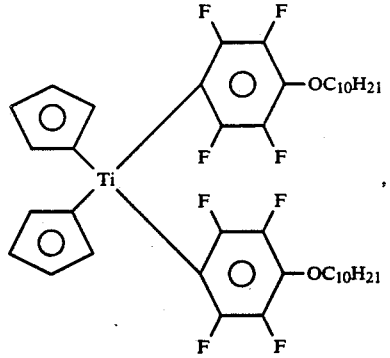

F-1:

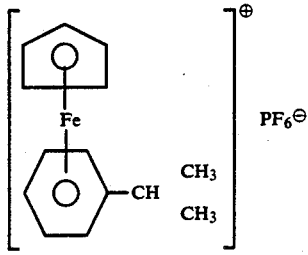

Nitrogen-containing compound:

-continued

N-1: 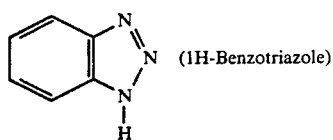 (1H-Benzotriazole)

N-2: 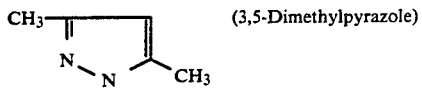 (3,5-Dimethylpyrazole)

N-3: 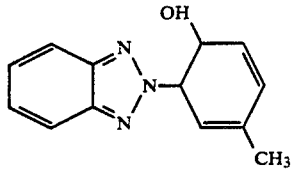

Resolution was investigated when images were formed with respect to several kinds of examples. Resolution was evaluated by pattern formability by direct image formation using NIKON LP-3000D made by NIKON Co., a highly accurate laser direct imaging apparatus. The pattern formability is represented as a value obtained vy dividing the thinnest line, which may be formed by removing the exposed part of the conductor after the development of an acid etchant or alkali etchant, by the space. The results are shown in Table 2.

TABLE 2

| Example | Exposure amount | Width of the thinnest line formable by etching/space |
|---|---|---|
| 1 | 10 mJ/cm$^2$ | 100 μm/100 μm |
| 17 | same as above | same as above |
| 18 | same as above | 50 μm/50 μm |
| 19 | 25 mJ/cm$^2$ | 125 μm/125 μm |
| 22 | 10 mJ/cm$^2$ | 60 μm/60 μm |
| 29 | same as above | same as above |
| 30 | same as above | 110 μm/110 μm |

What is claimed is:

1. A composition for visible light sensitive electrodeposition coating which comprises
   (A) a photocurable resin having light sensitive groups capable of being crosslinked or polymerized by light irradiation and ionic groups,
   (B) a sensitizer which is excited by absorption of visible light and interacts with the resin (A),
   (C) a water-insoluble polymerization initiator and
   (D) at least one of the nitrogen-containing compounds represented by the following general formulae (1) to (6)

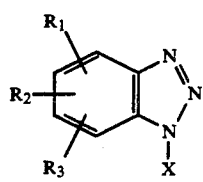 (1)

wherein X represents a hydrogen atom or hydroxy group, $R_1$, $R_2$ and $R_3$ independently represent a hydrogen atom, chlorine atom or alkyl group having 1 to 6 carbon atoms;

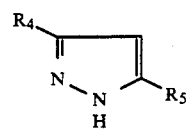 (2)

wherein $R_4$ and $R_5$ independently represent a hydrogen atom, or alkyl group having 1 to 6 carbon atoms;

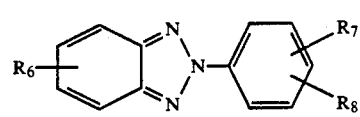 (3)

wherein $R_6$, $R_7$ and $R_8$ independently represent a hydrogen atom, hydroxyl group or alkyl group having 1 to 12 carbon atoms;

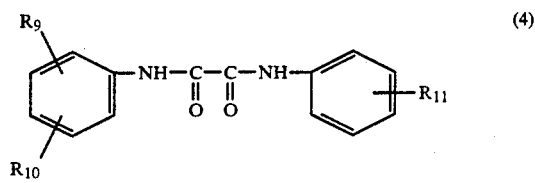 (4)

wherein $R_9$, $R_{10}$ and $R_{11}$ independently represent a hydrogen atom, hydroxyl group, alkyl group having 1 to 12 carbon atoms or alkoxy group having 1 to 12 carbon atoms;

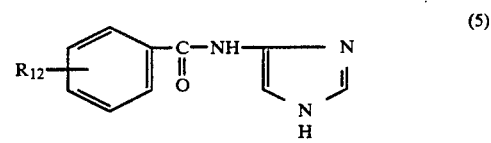 (5)

wherein $R_{12}$ represents a hydrogen atom, hydroxyl group, alkyl having 1 to 12 carbon atoms or alkoxy group having 1 to 12 carbon atoms;

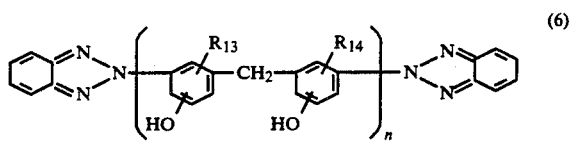 (6)

wherein $R_{13}$ and $R_{14}$ independently represent a hydrogen atom or alkyl group having 1 to 12 carbon atoms and n is an integer of 1 to 3.

2. The composition for electrodeposition coating of claims 1 wherein the light sensitive groups, which the photocurable resin (A) have, are selected from the group consisting of (meth)acryloyl groups, cinnamoyl groups and allyl groups.

3. The composition for electrodeposition coating of claim 1 wherein the content of the light sensitive groups in the photocurable resin (A) ranges from 0.2 to 5.0 moles/kg.

4. The composition for electrodeposition coating of claim 1 wherein the photocurable resin (A) has a glass transition temperature of 0° C. or higher and a number average molecular weight of 300 to 100,000.

5. The composition for electrodeposition coating of claim 1 wherein the photocurable resin (A) is an anionic resin obtained by adding a glycidyl group-containing unsaturated compound to an acrylic resin having a high acid value.

6. The composition for electrodeposition coating of claim 1 wherein the photocurable resin (A) is an anionic resin obtained by reacting a hydroxyl group-containing acrylic resin of a high acid value with a cinnamoyl halide.

7. The composition for electrodeposition coating of claim 1 wherein the photocurable resin (A) is an anionic resin obtained by adding ally glycidyl ether to an acrylic resin having a high acid value.

8. The composition for electrodeposition coating of claim 1 wherein the photocurable resin (A) is a cationic resin having tertiary amino groups or an onium salt in an amount of 0.2 to 5 moles/kg resin.

9. The composition for electrodeposition coating of claim 1 wherein the sensitizer (B) is a dye which is excited by absorption of visible light of 400 to 700 nm.

10. The composition for electrodeposition coating of claim 9 wherein the dye is selected from the group consisting of thioxanthene, xanthene, ketone, thiopyrylium salt, merocyanine, 3-substituted coumalin, cyanine, acridine and thiazine dyes.

11. The composition for electrodeposition coating of claim 1 wherein the amount of the sensitizer (B) to be used ranges from 0.1 to 10 weight parts per 100 weight parts by solid content of the photocurable resin (A).

12. The composition for electrodeposition coating of claim 1 wherein the water-insoluble polymerization initiator (C) has a solubility in water of 2 g/100 ml water or lower.

13. The composition for electrodeposition coating of claim 12 wherein the water-insoluble polymerization initiator (C) is selected from the group consisting of an organic peroxide, an iron-arene complex and a titanocene compound.

14. The composition for electrodeposition coating of claim 12 wherein the water-insoluble polymerization initiator is an iron-allene complex or a titanocene compound.

15. The composition for electrodeposition coating of claim 1 wherein the water-insoluble polymerization initiator (C) is used in a range of 0.1 to 25 weight parts per 100 weight parts of solid content of the photocurable resin (A).

16. The composition for electrodeposition coating of claim 1 wherein the nitrogen-containing compound is the benzotriazole represented by the general formula (1).

17. The composition for electrodeposition coating of claim 16 wherein the nitrogen-containing compound (D) is selected from the group consisting of the benzotriazoles of the following formulae:

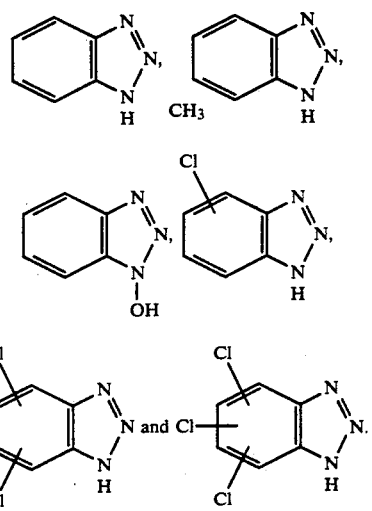

18. The composition for electrodeposition coating of claim 1 wherein the nitrogen-containing compound (D) is used in a range of 0.01 to 20 weight parts per 100 weight parts of solid content of the photocurable resin (A).

* * * * *